US009811413B2

(12) United States Patent
Ojalvo et al.

(10) Patent No.: US 9,811,413 B2
(45) Date of Patent: Nov. 7, 2017

(54) ORPHAN BLOCK MANAGEMENT IN NON-VOLATILE MEMORY DEVICES

(71) Applicant: Apple Inc., Cupertino, CA (US)

(72) Inventors: Shai Ojalvo, Moshav Olesh (IL); Yair Schwartz, Yokneam Illit (IL); Eyal Gurgi, Petah-Tikva (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 177 days.

(21) Appl. No.: 14/447,114

(22) Filed: Jul. 30, 2014

(65) Prior Publication Data

US 2016/0034341 A1    Feb. 4, 2016

(51) Int. Cl.
| G06F 11/00 | (2006.01) |
| G06F 11/10 | (2006.01) |
| G06F 3/06 | (2006.01) |
| G11C 29/00 | (2006.01) |

(52) U.S. Cl.
CPC .......... *G06F 11/1008* (2013.01); *G06F 3/064* (2013.01); *G06F 3/0619* (2013.01); *G06F 3/0688* (2013.01); *G06F 3/0689* (2013.01); *G06F 11/1076* (2013.01); *G06F 11/1096* (2013.01); *G11C 29/00* (2013.01)

(58) Field of Classification Search
CPC ............. G06F 11/1008; G06F 11/1076; G06F 11/1068; G06F 3/06; G06F 3/0689; G11B 20/1833
USPC .................................. 714/770, 773, 769, 763
See application file for complete search history.

(56) References Cited

U.S. PATENT DOCUMENTS

| 5,276,360 | A | * | 1/1994 | Fujima | ................. | G11C 29/781 326/10 |
| 5,283,790 | A | * | 2/1994 | Kawashita | ......... | G11B 20/1883 711/112 |
| 5,546,402 | A | * | 8/1996 | Niijima | ................. | G11C 16/16 365/185.09 |
| 6,223,252 | B1 | | 4/2001 | Bandera et al. | | |
| 6,397,293 | B2 | | 5/2002 | Shrader et al. | | |
| 6,944,791 | B2 | | 9/2005 | Humlicek et al. | | |
| 7,139,937 | B1 | * | 11/2006 | Kilbourne | ............. | G11C 11/406 710/110 |
| 7,523,257 | B2 | * | 4/2009 | Horn | ................... | G06F 11/2087 711/114 |
| 7,721,146 | B2 | | 5/2010 | Polisetti et al. | | |
| 8,156,392 | B2 | | 4/2012 | Flynn et al. | | |
| 8,301,942 | B2 | | 10/2012 | Galbraith et al. | | |
| 8,489,946 | B2 | | 7/2013 | Galbraith et al. | | |

(Continued)

FOREIGN PATENT DOCUMENTS

CN    102394923    3/2012

*Primary Examiner* — Albert Decady
*Assistant Examiner* — Osman M Alshack
(74) *Attorney, Agent, or Firm* — Meyertons, Hood, Kivlin, Kowert & Goetzel, P.C.

(57) ABSTRACT

A system for data storage includes one or more non-volatile memory (NVM) devices, each device including multiple memory blocks, and a processor. The processor is configured to assign the memory blocks into groups, to apply a redundant data storage scheme in each of the groups, to identify a group of the memory blocks including at least one bad block that renders remaining memory blocks in the group orphan blocks, to select a type of data suitable for storage in the orphan blocks, and to store the data of the identified type in the orphan blocks.

12 Claims, 3 Drawing Sheets

(56) References Cited

U.S. PATENT DOCUMENTS

| | | |
|---|---|---|
| 8,560,922 B2 | 10/2013 | Bivens et al. |
| 8,601,311 B2 | 12/2013 | Horn |
| 2002/0138559 A1 | 9/2002 | Ulrich et al. |
| 2004/0196707 A1 | 10/2004 | Yoon et al. |
| 2007/0294570 A1* | 12/2007 | Polisetti .............. G06F 11/1076 714/6.13 |
| 2009/0204778 A1* | 8/2009 | Marking .............. H04N 7/1675 711/163 |
| 2009/0282301 A1* | 11/2009 | Flynn .................... G06F 11/006 714/710 |
| 2010/0037091 A1 | 2/2010 | Baderdinni et al. |
| 2013/0042053 A1* | 2/2013 | Huang .................. G06F 11/106 711/103 |
| 2013/0148451 A1* | 6/2013 | Matsuo ................ G11C 29/848 365/200 |
| 2014/0164881 A1* | 6/2014 | Chen ...................... G11C 16/00 714/773 |
| 2014/0359382 A1* | 12/2014 | Choi .................. G06F 11/2094 714/710 |
| 2015/0162093 A1* | 6/2015 | Oh ...................... G11C 16/3445 365/185.11 |

* cited by examiner

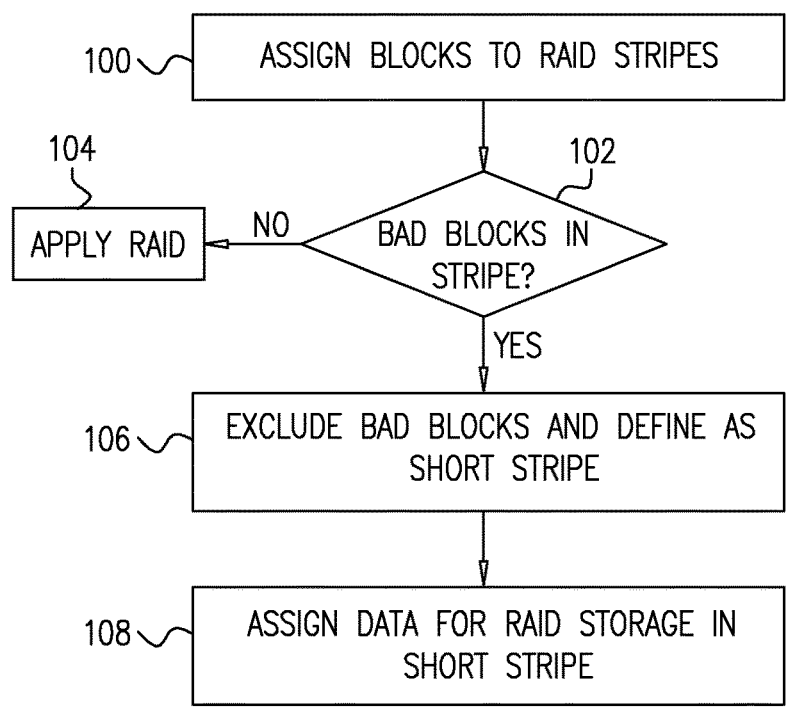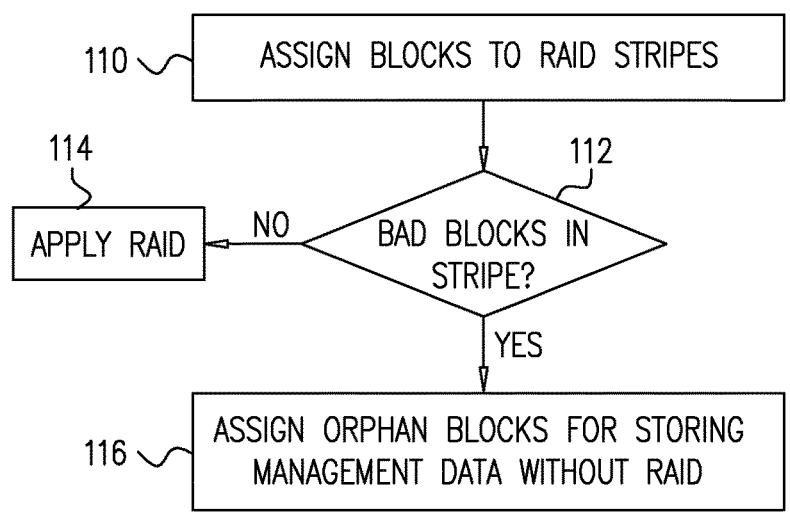

ORPHAN BLOCK MANAGEMENT IN NON-VOLATILE MEMORY DEVICES

FIELD OF THE INVENTION

The present invention relates generally to memory devices, and particularly to methods and systems for redundant data storage in non-volatile memory devices.

BACKGROUND OF THE INVENTION

Several types of non-volatile memory (NVM) systems use redundant storage schemes, such as redundant array of inexpensive disks (RAID) schemes. Such devices are subject to bad memory blocks, and several techniques to manage bad blocks are known in the art. For example, U.S. Pat. No. 7,721,146, whose disclosure is incorporated herein by reference, describes a system and method for managing bad blocks that utilizes a remapping pool formed across an array of disks to remap bad blocks formed on individual disks.

U.S. Pat. No. 8,489,946, whose disclosure is incorporated herein by reference, describes management of logically bad blocks in storage devices. At least one standard size data block of a storage device is scanned for a logically bad pattern. If the logically pad pattern is detected, a block address that is associated with the standard size data block is added to a bad block table. The logically bad pattern may have a first predefined data portion and a second predefined data portion and may be repeated the requisite number of instances to fill the standard size data block.

U.S. Pat. No. 8,301,942, whose disclosure is incorporated herein by reference, describes methods and a computer program product related to management of possibly logically bad blocks in storage devices. A logically bad pattern is placed in a standard size data block if data associated with the data block has previously been stored or is waiting to be stored, but has subsequently become lost. A data check response may be given if the logical block address is present in a Bad Block Table.

U.S. Pat. No. 8,156,392, whose disclosure is incorporated herein by reference, describes apparatus, system, and method for bad block remapping. A bad block identifier module identifies one or more data blocks on a solid-state storage element as bad blocks. A bad block mapping module accesses at least one bad block log during a start-up operation to create in memory a bad block map. Data is stored in each replacement block instead of the corresponding bad block. The bad block mapping module creates the bad block map using one of a replacement block location and a bad block mapping algorithm.

U.S. Pat. No. 8,560,922, whose disclosure is incorporated herein by reference, describes a method for bad block management for flash memory. The method includes receiving a write request that includes write data. A block of memory is identified for storing the write data. The block of memory includes a plurality of pages. A bit error rate (BER) of the block of memory is determined and expanded write data is created from the write data in response to the BER exceeding a BER threshold. The expanded write data is characterized by an expected BER that is lower than the BER threshold. The expanded write data is encoded using an error correction code (ECC). The encoded expanded write data is written to the block of memory.

U.S. Pat. No. 8,601,311, whose disclosure is incorporated herein by reference, describes system and method for using over-provisioned data capacity to maintain a data redundancy scheme in a solid state memory. Embodiments utilize the additional over-provisioned capacity and potentially modify the stripe size to restore RAID redundancy when a storage element or path (i.e., page, block, plane, die, channel, etc.) has failed. In some cases, this may also involve reducing the RAID stripe size.

U.S. Pat. No. 7,523,257, whose disclosure is incorporated herein by reference, describes a method of managing bad blocks in a RAID storage system. The system restores physical storage media and stripe redundancy by reassigning sectors and creating a bad block tracking structure.

SUMMARY OF THE INVENTION

An embodiment of the present invention that is described herein provides a system for data storage including one or more non-volatile memory (NVM) devices, each device including multiple memory blocks, and a processor. The processor is configured to assign the memory blocks into groups, to apply a redundant data storage scheme in each of the groups, to identify a group of the memory blocks including at least one bad block that renders remaining memory blocks in the group orphan blocks, to select a type of data suitable for storage in the orphan blocks, and to store the data of the identified type in the orphan blocks.

In some embodiments, the redundant data storage scheme includes a redundant array of inexpensive disks (RAID) scheme. In other embodiments, the redundant storage scheme is defined over a first number of the memory blocks, and the processor is configured to store the data of the identified type in the orphan blocks in a modified redundant data storage scheme, which is defined over a second number of the memory blocks, smaller than the first number. In yet other embodiments, the processor is configured to store the data of the identified type in the orphan blocks without applying the redundant data storage scheme.

In an embodiment, in absence of memory blocks of a given capacity for assignment, the processor is configured to merge multiple memory blocks of a capacity that is lower than the given capacity, and to assign the merged memory blocks. In another embodiment, the processor is configured to distribute the memory blocks of each group over multiple memory dice, and, in absence of memory blocks for assignment in a given memory die, to re-assign at least one memory block from another memory die. In yet another embodiment, the processor is configured to store management information in the orphan blocks. In an alternative embodiment, the processor is configured to store in the orphan blocks information that is less performance-sensitive than the information stored in the memory blocks other than the orphan blocks.

There is additionally provided, in accordance with an embodiment of the present invention, a method including, in a memory, which includes one or more NVM devices, each NVM device including multiple memory blocks, assigning the memory blocks into groups and applying a redundant data storage scheme in each of the groups. A group of the memory blocks, including at least one bad block that renders remaining memory blocks in the group orphan blocks, is identified. A type of data suitable for storage in the orphan blocks is selected, and the data of the identified type is stored in the orphan blocks.

There is further provided, in accordance with an embodiment of the present invention, a method including, in a memory, which includes one or more NVM devices, each NVM device including multiple memory blocks, assigning the memory blocks into groups and applying a redundant data storage scheme in each of the groups. A group including a bad block is identified, and the bad block is replaced with a functional block that is external to the group.

The present invention will be more fully understood from the following detailed description of the embodiments thereof, taken together with the drawings in which:

BRIEF DESCRIPTION OF THE DRAWINGS

FIGS. 4 and 5 are flow charts that schematically illustrates methods for orphan block management in a RAID scheme, in accordance with embodiments of the present invention.

DETAILED DESCRIPTION OF EMBODIMENTS

Overview

Figure 1:
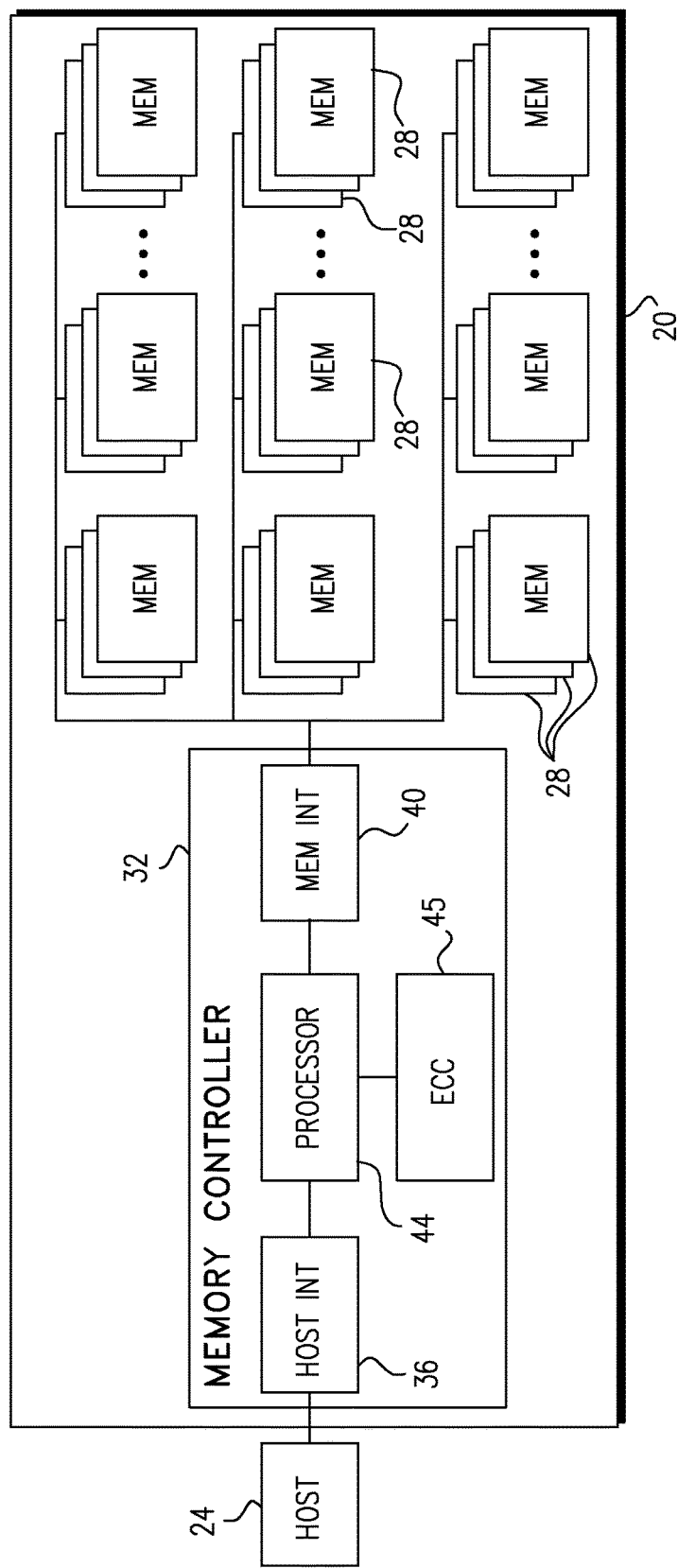
FIG. 1 is a block diagram that schematically illustrates a memory system, in accordance with an embodiment of the present invention.

Memory systems commonly use a memory controller that controls multiple non-volatile memory (NVM) devices. The term "memory device" or "NVM device" may refer to unpackaged dice, packaged memory devices, or any other suitable kind of memory unit, and the terms "die" and "device" are used interchangeably herein. Each NVM device typically comprises multiple memory blocks. Such memory systems are required to provide high storage capacity, as well as high operational speed and storage reliability.

Redundant data storage schemes, such as a redundant array of inexpensive disks (RAID), may be applied by the memory controller to fulfill the above requirements. In a possible RAID scheme, the memory controller allocates a block from each NVM die to create a group of blocks (also referred to as a stripe), which is a virtual NVM unit comprising multiple blocks from the multiple NVM dice. Redundant storage, e.g., RAID, is applied within each stripe. Although the embodiments described herein refer mainly to RAID schemes, for the sake of clarity, the methods and systems described herein can be used with any other suitable redundant storage scheme that distributes data over multiple memory devices.

In practice, the NVM dice may accumulate bad blocks during manufacturing and/or during the device service. Unless accounted for, a bad block in a given stripe may disqualify the given stripe from serving as a memory unit in the RAID scheme. Accordingly, the other (good) blocks of the given stripe cannot be used in the RAID scheme and are denoted orphan blocks. Furthermore, since the number of good blocks may differ from one die to another due to different numbers of bad blocks per die, orphan blocks will typically remain after the blocks are assigned to stripes.

Embodiments of the present invention that are described herein below provide improved methods and systems for orphan block management in redundant data storage schemes applied on NVM-based memory systems.

In some embodiments, the memory controller uses an orphan block from a given die to substitute a bad block from another die in the same stripe, and thus, requalifies the stripe for the RAID scheme. In other embodiments, the memory controller substitutes a bad block of a given capacity with multiple good blocks of lower capacities to maintain the original storage capacity in a given stripe. For example, the memory controller may merge two single-level cell (SLC) blocks (each comprising 1 bit/cell) to substitute a single multi-level cell (MLC) (2 bits/cell) bad block of a given stripe. In yet another embodiment, a virtual MLC block (made of the two SLC blocks) can be used to create a longer stripe comprising more blocks and hence, higher storage capacity.

In many cases, the data sent for storage in the memory comprises data sets with different levels of sensitivity for performance (e.g., speed, reliability). For example, certain kinds of management information, such as journaling, is considered less performance-sensitive. In some embodiments orphan blocks may be used to store management information or other kinds of performance-insensitive data in shorter stripes of a RAID scheme or entirely without applying RAID.

The disclosed techniques improve the utilization of orphan blocks, and thus improve the memory performance (e.g., capacity and speed). The disclosed techniques are useful, for example, when the memory system is produced using "mix-and-match" methods. "Mix-and-match" processes typically select memory devices, for a given system, while considering the overall average number of bad blocks across the multiple memory devices. Such a process allows dice with a high number of bad blocks to still be used, by pairing them with dice having small numbers of bad blocks.

Although "mix-and-match" techniques increase the yield of memory system manufacturers, they typically create stripes from dice that differ considerably in the number of bad blocks, and hence, more orphan blocks. The disclosed techniques enable the higher yield (e.g., device cost reduction) of "mix-and-match" production, without compromising memory performance due to the presence of orphan blocks.

System Description

FIG. 1 is a block diagram that schematically illustrates a multi-device memory system 20, in accordance with an embodiment of the present invention. System 20 accepts data for storage from a host 24 and stores it in memory, and retrieves data from memory and provides it to the host. In the present example, system 20 comprises a Solid-State Disk (SSD) that stores data for a host computer. In alternative embodiments, however, system 20 may be used in any other suitable application and with any other suitable host, such as in computing devices, mobile phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory —PCM), Nitride Read Only Memory (NROM), Ferroelectric RAM (FRAM) and/or magnetic RAM (MRAM), can also be used.

In the context of the present patent application and in the claims, the term, "analog memory cell" is used to describe any non-volatile memory (NVM) cell that holds a continuous, analog value of a physical parameter, such as an electrical voltage or charge. Any suitable type of analog memory cells, such as the types listed above, can be used. In the present example, each memory device 28 comprises a NVM of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

The memory cells are typically arranged in rows and columns. Typically, a given memory device comprises multiple erasure blocks (also referred to as memory blocks), i.e., groups of memory cells that are erased together. Data typically cannot be reprogrammed in-place, and memory blocks are therefore erased before being programmed with other data.

As noted above, each memory device 28 may comprise a packaged device or an unpackaged semiconductor chip or die. A typical memory system may comprise a number of 4 GB, 8 GB or higher capacity memory devices. Generally, however, system 20 may comprise any suitable number of memory devices of any desired type and size.

System 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. In some embodiments, controller 32 encodes the stored data with an Error Correction Code (ECC) 45. In these embodiments, controller 32 comprises an ECC unit 45, which encodes the data before stored in devices 28 and decodes the ECC of data retrieved from devices 28. The functions of processor 44 can be implemented, for example, using software running on a suitable Central Processing Unit (CPU), using hardware (e.g., state machine or other logic), or using a combination of software and hardware elements.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dice in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dice in the same device package.

Orphan Block Management in Redundant Data Storage Schemes of Non-Volatile Memory Devices In some embodiments, memory controller 32 applies in memory devices 28 a redundant data storage scheme, such as RAID. The memory controller may apply any suitable scheme that stores redundancy information in addition to the data. In various embodiments that are described below, the memory controller reduces the number of orphan blocks, or reuses orphan blocks, so as to improve the memory system performance.

Figure 2:
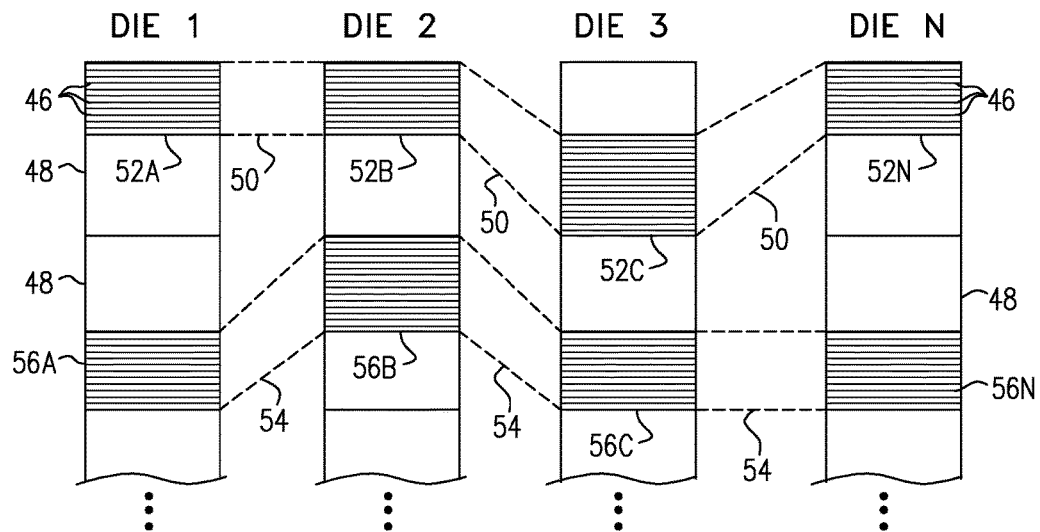
FIG. 2 is a block diagram that schematically illustrates a memory system that operates in a RAID scheme, in accordance with an embodiment of the present invention.

FIG. 2 is a block diagram that schematically illustrates a memory system that operates in a RAID scheme, in accordance with an embodiment of the present invention. The example of FIG. 2 shows N memory dice denoted Die 1-Die N, each die comprising multiple memory blocks 48. In the present example, memory controller 32 applies RAID in groups of memory blocks referred to as stripes. The figure shows two example stripes 50 and 54. Stripe 50, for example, comprises N blocks 52A-52N. Each block in stripe 50 resides in a different die and comprises multiple pages 46 where data is stored.

When using stripes, system 20 accumulates N−1 pages of incoming data and then calculates the redundancy information for the N−1 pages. Then, system 20 stores the N−1 pages in N−1 respective blocks of a stripe, and the redundancy information in the $N^{th}$ block of the stripe, denoted a parity block in this example. The parity block may comprise any block in the stripe. If a certain block fails (e.g., because its die has failed), system 20 can recover the data stored in that block using (1) data from the other N−1 blocks in the stripe and (2) the redundancy information stored in the parity block of the stripe.

Note that a stripe does not necessarily contain the $k^{th}$ physical block from each die. The assignment of blocks to stripes (or other types of groups), by the memory controller, is often logical rather than physical.

As explained above, memory devices 28 may comprise bad blocks. Unless accounted for, a bad block in a stripe of a RAID scheme makes the stripe not functional, and hence, the other good blocks of the stripe are not useful for the RAID scheme. In the example of FIG. 2, stripe 54 comprises N blocks, 56A-56N. Block 56A is a bad block, which makes stripe 54 non-functional. In this case, the other N−1 blocks in stripe 54 (i.e., blocks 56B-56N) are defined as orphan blocks.

In some embodiments the orphan blocks (e.g., blocks 56B-56N), can be used to store data using a modified RAID scheme, as well as in non-RAID schemes as described herein below. The term "non-RAID" refers to any scheme of memory that does not utilize redundant storage across different blocks.

Figure 3:
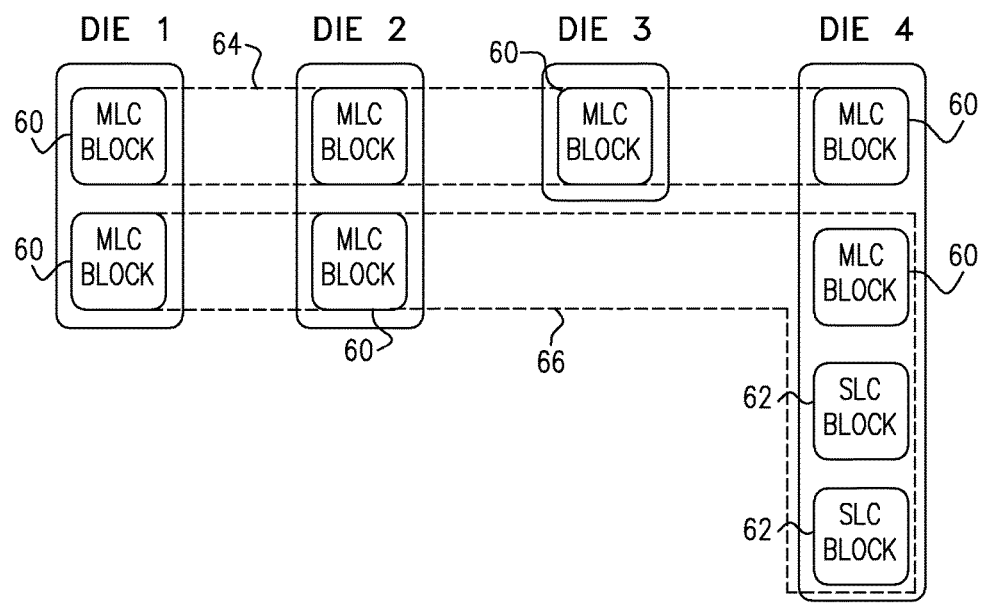
FIG. 3 is a block diagram that schematically illustrates bad block recovery in a RAID scheme, in accordance with an embodiment of the present invention.

FIG. 3 is a block diagram that schematically illustrates bad block recovery in a RAID scheme, in accordance with an embodiment of the present invention. The configuration in FIG. 3 comprises four dice, denoted die 1-die 4. Dice 1, 2 and 4 comprise two MLC blocks 60 each, while die 3 comprises a single MLC block 60 as the second block is a bad block, and hence, missing in the second row of die 3.

In this RAID scheme, a stripe 64 comprises four MLC blocks 60, one from each die, and hence four times 2 bits/cell in total. A stripe 66, on the other hand, has no block in die 3, e.g., due to an excessive number of bad blocks on that die. In an embodiment, memory controller 32 replaces the missing MLC block of stripe 66 with a combination of two good (i.e., functional) single-level cell (SLC) blocks 62 (comprising 1 bit/cell each), located in die 4. In this scheme, stripe 66 comprises the same storage capacity as stripe 64. Thus, memory controller 32 applies in stripe 66 three MLC blocks 60 and two SLC blocks 62 instead of four MLC blocks 60. In this embodiment, the memory controller makes stripe 66 an active stripe and saves its respective three MLC blocks 60 from being orphan blocks.

In other embodiments, controller 32 merges two orphan SLC blocks 62 as a single logical MLC block 60, and can be used either to replace a bad block in a given stripe, as shown in FIG. 3, or to create longer stripes (than the given stripe) with higher storage capacity using the two SLC orphan blocks. In yet other embodiments, an additional MLC block may be used to substitute multiple SLC blocks with possibly some impact on performance (e.g., speed or reliability).

The example above demonstrates two features of the disclosed techniques. In some embodiments, memory controller 32 is configured to distribute the memory blocks of each group (e.g., stripe) over multiple memory dice, and, in absence of memory blocks for assignment in a given memory die, to re-assign at least one memory block from another memory die. In another embodiment, in absence of memory blocks for assignment to a given stripe, memory controller 32 merges multiple memory blocks of a lower capacity, and assigns the merged memory blocks to the given stripe.

In some embodiments, when one or more bad blocks are found in a stripe, controller 32 may apply a modified RAID (or any other suitable redundant storage) scheme in the orphan blocks. For example, the nominal RAID scheme used in system 20 is typically defined over a given number of memory blocks. When bad blocks are detected, controller 32 is configured to store data in the orphan blocks using a modified RAID scheme, which uses a smaller number of blocks (a shorter stripe) than the nominal RAID scheme. Other examples of using modified redundant storage schemes, such as for handling multiple bad blocks per stripe, are possible.

In other embodiments, memory controller 32 may use orphan blocks to store other types of data, such as management information, which is less critical for the operation of the system and hence does not have to be stored in a RAID scheme.

FIG. 4 is a flow chart that schematically illustrates a method for orphan block management in a RAID scheme, in accordance with an embodiment of the present invention. The method begins with memory controller 32 assigning blocks to RAID stripes, at a block assignment step 100. At a decision step 102, memory controller 32 checks whether there are bad blocks in the assigned RAID stripes.

If all blocks are good, memory controller 32 applies RAID in memory devices 28, at a RAID applying step 104. Otherwise, at a bad blocks exclusion step 106, in case memory controller 32 detects one or more bad blocks in a given stripe of a memory device 28, the memory controller excludes these bad blocks from their respective stripe and redefines the given stripe as a short stripe. Subsequently, at a data assignment step 108, memory controller 32 assigns data for RAID scheme storage in the given short stripe.

In some embodiments, memory controller 32 assigns journaling data (e.g., log files) for RAID storage in the given short stripe. Journaling is typically less sensitive to storage performance, since its content does not accumulate as fast as user data. Therefore, journaling data can be stored in short dedicated stripes. In this embodiment the presented technique increases the number of overall stripes in the system and reduces the number of orphan blocks in system 20. In an alternative embodiment, journaling may be stored in orphan blocks in a non-RAID scheme.

FIG. 5 is a flow chart that schematically illustrates a method for orphan block management, in accordance with another embodiment of the present invention. The method begins at a block assignment step 110, where memory controller 32 assigns blocks in memory devices 28 to RAID stripes. At a decision step 112, memory controller 32 checks whether there are bad blocks in the RAID stripes.

If all blocks are good, memory controller 32 applies a RAID scheme in memory devices 28, at a RAID applying step 114. In case memory controller 32 detects one or more bad blocks in a given stripe of memory device 28, then, at an orphan blocks assignment step 116, memory controller 32 deletes this given stripe from the RAID scheme and assigns its respective orphan blocks for storing management information without RAID.

In some embodiments orphan blocks may store management information such as internal data structures, power down information, power states information, trim information, or any other suitable type of management information.

Additionally or alternatively, memory controller 32 may use orphan blocks to store other types of data such as failure analysis logs and small user partitions, or data in a utilities area comprising information which is less sensitive to memory performance compared to the information stored in the memory blocks other than the orphan blocks.

In other embodiments, journaling data may be stored in SLC orphan blocks without RAID. SLC has inferior capacity compared to MLC, however SLC speed and reliability performance are superior to MLC. As such, SLC storage can be used for storage without RAID, while meeting the memory system's specification. In alternative embodiments, orphan blocks may store copies of ROM extension and firmware versions of system 20. Further additionally or alternatively, memory controller 32 may use orphan blocks as SLC buffers (also referred to as "binary cache" or "SLC cache"), for fast temporary caching of incoming data.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A system for data storage, comprising:
one or more non-volatile memory (NVM) devices located on a plurality of memory dice,
wherein each NVM device includes a plurality of memory blocks; and
a processor configured to:
assign a respective subset of the plurality of memory blocks into a particular group of a plurality of groups, wherein the respective subset includes memory blocks located on at least two memory dice of the plurality of memory dice;

after assigning a respective subset of the plurality of memory blocks into the one of the plurality of groups:

in response to a determination that a particular group of the plurality of groups includes at least one bad memory block:

designate remaining memory blocks in the particular group as orphan blocks; and store management data in the orphan blocks, wherein the management data includes power state information;

otherwise, store data in memory blocks of the particular group using a redundant data storage scheme; and wherein to assign the respective subset of the plurality of memory blocks into the particular group, the processor is further configured to, in response to a determination that at least one memory block is unavailable for assignment in a particular memory die of the at least two memory dice, assign a particular memory block included in another memory die of the at least two memory dice into the particular group.

2. The system according to claim 1, wherein the redundant data storage scheme comprises a redundant array of inexpensive disks (RAID) scheme.

3. The system according to claim 1, wherein the redundant data storage scheme is defined over a first number of the memory blocks, and wherein the processor is further configured to store the management data in the orphan blocks in a modified redundant data storage scheme, which is defined over a second number of the memory blocks, smaller than the first number.

4. The system according to claim 1, wherein the processor is further configured to store the management data in the orphan blocks without applying the redundant data storage scheme.

5. The system according to claim 1, wherein, in response to a determination that memory blocks of a given capacity are absent, and wherein to assign the respective subset of the plurality of memory blocks, the processor is further configured to merge multiple memory blocks of a capacity that is lower than the given capacity.

6. The system according to claim 1, wherein the processor is further configured to store, in the orphan blocks, information that is less performance-sensitive than the information stored in the memory blocks other than the orphan blocks.

7. A method, comprising:

in a memory, which includes one or more non-volatile memory (NVM) devices located on a plurality of memory dice, wherein each NVM device includes a plurality of memory blocks, assigning a respective subset of the plurality of memory blocks into a particular group of a plurality of groups, wherein the respective subset includes memory blocks located on at least two memory dice of the plurality of memory dice;

wherein assigning the respective subset of the plurality of memory blocks into the particular group includes, in response to determining that at least one memory block is unavailable for assignment in a particular memory die of the at least two memory dice, assigning a particular memory block included in another memory die of the at least to memory dice into the particular group;

after assigning a respective subset of the plurality memory blocks into the one of the plurality of groups:

in response to determining that a particular group of the plurality of groups includes at least one bad memory block:

designating remaining memory blocks in the particular group as orphan blocks; and storing management data in the orphan blocks, wherein the management data includes power state information;

otherwise, storing data in the memory blocks of the particular group using a redundant data storage scheme.

8. The method according to claim 7, wherein the redundant data storage scheme comprises a redundant array of inexpensive disks (RAID) scheme.

9. The method according to claim 7, wherein applying the redundant data storage scheme comprises defining the redundant data storage scheme over a first number of the memory blocks, and wherein storing the management data includes applying a modified redundant data storage scheme, which is defined over a second number of the memory blocks, smaller than the first number.

10. The method according to claim 7, wherein storing the management data in the orphan blocks includes storing the data that includes the power state information without applying the redundant data storage scheme.

11. The method according to claim 7, wherein assigning the respective subset of the plurality of memory blocks includes, in response to determining memory blocks of a given capacity are absent, merging multiple memory blocks of a capacity that is lower than the given capacity.

12. The method according to claim 7, wherein storing the management data includes storing, in the orphan blocks, information that is less performance-sensitive relative to information stored in the memory blocks other than the orphan blocks.

* * * * *